(12) United States Patent
Hu et al.

(10) Patent No.: US 11,733,289 B2
(45) Date of Patent: Aug. 22, 2023

(54) CHIP CRACK DETECTION APPARATUS

(71) Applicant: HUAWEI TECHNOLOGIES CO., LTD., Shenzhen (CN)

(72) Inventors: Weiguo Hu, Shanghai (CN); Yisheng Hu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 73 days.

(21) Appl. No.: 17/536,545

(22) Filed: Nov. 29, 2021

(65) Prior Publication Data
US 2022/0082612 A1    Mar. 17, 2022

Related U.S. Application Data

(63) Continuation of application No. PCT/CN2019/089688, filed on May 31, 2019.

(51) Int. Cl.
*G01R 31/28* (2006.01)

(52) U.S. Cl.
CPC ..... *G01R 31/2853* (2013.01); *G01R 31/2894* (2013.01)

(58) Field of Classification Search
CPC . G01R 31/2853; G01R 31/2894; H01L 22/34; H01L 23/585; H01L 23/642; H01L 23/647; H01L 23/562
USPC ........................................ 324/538, 537, 500
See application file for complete search history.

(56) References Cited

U.S. PATENT DOCUMENTS

| | | |
|---|---|---|
| 6,449,748 B1 | 9/2002 | Jeng et al. |
| 7,649,200 B1 | 1/2010 | Miller et al. |
| 9,287,184 B2 | 3/2016 | Dennison et al. |
| 9,786,733 B2 | 10/2017 | Barth et al. |
| 2008/0035923 A1 | 2/2008 | Tschmelitsch et al. |

(Continued)

FOREIGN PATENT DOCUMENTS

| | | |
|---|---|---|
| CN | 107068637 A | 8/2017 |
| CN | 107068654 A | 8/2017 |

(Continued)

OTHER PUBLICATIONS

Extended European Search Report issued in corresponding European Application No. 19931357.8, dated May 11, 2022, pp. 1-14.

(Continued)

*Primary Examiner* — Giovanni Astacio-Oquendo

(74) *Attorney, Agent, or Firm* — Hauptman Ham, LLP

(57) ABSTRACT

A chip crack detection apparatus includes a function circuit and a die crack detection module surrounding the function circuit. The die crack detection module includes a front-end-of-line device layer, a laminated structure on the front-end-of-line device layer that includes a conducting wire in the laminated structure, a detection interface, and a capacitor at the front-end-of-line device layer. A first end of the conducting wire is configured to connect to a positive electrode of a power supply. A second end of the conducting wire is configured to connect to a negative electrode of the power supply. The capacitor is connected in parallel between the first end and the second end of the conducting wire. The detection interface is coupled with the conducting wire between the first end and the second end of the conducting wire. The detection interface is configured to detect whether a die crack occurs in the chip.

20 Claims, 10 Drawing Sheets

(56) References Cited

U.S. PATENT DOCUMENTS

| | | |
|---|---|---|
| 2011/0221460 A1 | 9/2011 | Trebo et al. |
| 2015/0115266 A1 | 4/2015 | Sanchez et al. |
| 2016/0240475 A1 | 8/2016 | Park et al. |
| 2016/0300800 A1 | 10/2016 | Zeng et al. |
| 2017/0018511 A1 | 1/2017 | Chou et al. |
| 2017/0103929 A1* | 4/2017 | Lee ..................... H01L 23/562 |
| 2017/0133289 A1 | 5/2017 | Gietler et al. |
| 2018/0145002 A1* | 5/2018 | Munder ................. H01L 23/66 |
| 2020/0144139 A1* | 5/2020 | Munder ............... H01L 23/645 |

FOREIGN PATENT DOCUMENTS

| | | |
|---|---|---|
| CN | 108700531 A | 10/2018 |
| CN | 109564172 A | 4/2019 |

OTHER PUBLICATIONS

International Search Report issued in corresponding International Application No. PCT/CN2019/089688, dated Dec. 25, 2019, pp. 1-12.

* cited by examiner (1) Sectional view in an AA' direction (2) Schematic diagram of a structure of a circuit Sectional view in an AA' direction (1) Sectional view in an AA' direction (1) Sectional view in an AA' direction Top view

CHIP CRACK DETECTION APPARATUS

CROSS-REFERENCE TO RELATED APPLICATIONS

This application is a continuation of International Application No. PCT/CN2019/089688, filed on May 31, 2019, the disclosure of which is hereby incorporated by reference in its entirety.

TECHNICAL FIELD

This application relates to the field of integrated circuit technologies, and in particular, to a chip crack detection apparatus.

BACKGROUND

An integrated circuit (integrated circuit, IC) is usually formed on a wafer (wafer) of a semiconductor material, and the wafer is subsequently cut into separate dies (dies), which are packaged into chips. A chip may be understood as an integrated circuit product. Each die may include millions of elements (for example, transistors, diodes, and resistors). However, in a processing and manufacturing process (for example, cutting), a crack or delamination may occur inside a chip (mainly in a function circuit in the chip), that is, a die crack occurs in the chip. The crack may run through the chip and cause a chip failure. Therefore, detecting whether a crack exists in a chip is significant, and detecting whether a crack exists in a chip may be referred to as die crack (die crack) detection.

In a conventional technology, a conducting wire surrounding a function circuit in a chip is disposed at a metal layer in a periphery of the chip. One end of the conducting wire is coupled to a power supply. A signal output from the other end of the conducting wire is measured, and whether a die crack occurs in the chip is determined based on the signal output from the conducting wire. However, because the conducting wire used to detect a die crack surrounds the function circuit in the chip, an interference signal is transferred to the function circuit, which causes interference to the function circuit.

SUMMARY

This application provides a chip crack detection apparatus, to reduce interference to a function circuit in a chip while implementing die crack detection. The apparatus includes a function circuit and a die crack detection module located around the function circuit. The die crack detection module includes a front-end-of-line device layer and a laminated structure disposed on the front-end-of-line device layer, a conducting wire is formed in the laminated structure, and one or more first capacitors are formed at the front-end-of-line device layer. A first end of the conducting wire is configured to connect to a positive electrode of a power supply, and a second end of the conducting wire is configured to connect to a negative electrode of the power supply. The first capacitor is connected in parallel between the first end of the conducting wire and the second end of the conducting wire. A detection interface is disposed between the first end and the second end of the conducting wire, and the detection interface is configured to detect whether a die crack occurs in the chip.

According to the foregoing solution, in this embodiment of this application, whether a die crack occurs in the chip may be determined by detecting a voltage between the detection port and a first port of the conducting wire L and a voltage between the detection port and a second port of the conducting wire L in the die crack detection module of the chip crack detection apparatus. In addition, the first capacitor connected in parallel between the first end and the second end of the conducting wire can guide, by using the second end of the conducting wire, an interference signal transmitted on the conducting wire (including an interference signal generated by the die crack detection module and an interference signal coupled to the conducting wire) into the ground or into another path that does not affect the function circuit. This reduces impact of the interference signal transmitted on the conducting wire on the function circuit. In other words, the die crack detection module in the chip crack detection apparatus provided in this embodiment of this application not only can implement die crack detection, but also can reduce the impact of the interference signal transmitted on the conducting wire in the die crack detection module on the function circuit.

In a possible implementation, the conducting wire may include a first conducting wire and a second conducting wire, the first conducting wire and the second conducting wire both extend along a length direction of the laminated structure, the first conducting wire covers a thickness direction of the laminated structure and a width direction of the laminated structure, the second conducting wire covers the thickness direction of the laminated structure and the width direction of the laminated structure, and the first conducting wire and the second conducting wire form a second capacitor. A first end of the first conducting wire is configured to connect to the positive electrode of the power supply, a second end of the first conducting wire is connected to a first end of the second conducting wire, a second end of the second conducting wire is configured to connect to the negative electrode of the power supply, and the detection interface is disposed on a connection line between the second end of the first conducting wire and the first end of the second conducting wire.

According to the foregoing solution, the second capacitor formed by the first conducting wire and the second conducting wire is connected in parallel to the first capacitor. This can increase a capacitance of a capacitor configured to filter out an interference signal transmitted on the first conducting wire and the second conducting wire, and further reduce interference caused to the function circuit by the interference signal transmitted on the first conducting wire and the second conducting wire.

In a possible implementation, in the extension direction of the first conducting wire and the second conducting wire, the first conducting wire and the second conducting wire are alternately distributed and spaced from each other.

In a possible implementation, the laminated structure includes at least three stacked metal layers. The first conducting wire is a serpentine wiring structure, and includes a first part, second parts, and a third part. The first part is located at a first metal layer, and is configured to connect two second parts adjacent to the first part. The second parts are located at another metal layer other than the first metal layer and a second metal layer. The third part is located at the second metal layer, and is configured to connect two second parts adjacent to the third part. The first metal layer is a bottom metal layer in the laminated structure, that is, a metal layer in the laminated structure that is adjacent to the front-end-of-line device layer. The second metal layer is a top metal layer in the laminated structure, that is, a metal layer in the laminated structure that is farthest from the front-end-of-line device layer. In other words, the first part, the second parts, and the third part are connected to each other in the laminated structure to form the first conducting wire. The second conducting wire is also a serpentine wiring structure, and includes a fourth part, fifth parts, and a sixth part. The fourth part is located at the first metal layer, and is configured to connect two fifth parts adjacent to the fourth part. The fifth parts are located at another metal layer other than the first metal layer and the second metal layer. The sixth part is located at the second metal layer, and is configured to connect two fifth parts adjacent to the sixth part. In other words, the fourth part, the fifth parts, and the sixth part are connected to each other in the laminated structure to form the second conducting wire.

The second parts and the fifth parts are alternately distributed and spaced from each other in the laminated structure in the extension direction of the first conducting wire and the second conducting wire, the first part does not intersect the fourth part, and the third part does not intersect the sixth part (the first conducting wire does not intersect the second conducting wire).

In a possible implementation, parts in the second part of the first conducting wire that are located at two adjacent metal layers are staggered in the thickness direction of the laminated structure, and parts in the fifth part of the second conducting wire that are located at two adjacent metal layers are staggered in the thickness direction of the laminated structure.

According to the foregoing solution, because the parts in the second part of the first conducting wire that are located at two adjacent metal layers are staggered in the thickness direction of the laminated structure, and the parts in the fifth part of the second conducting wire that are located at two adjacent metal layers are staggered in the thickness direction of the laminated structure, an area in which the first conducting wire and the second conducting wire are directly opposite to each other can be increased, and a capacitance of the capacitor formed by the first conducting wire and the second conducting wire can be further increased. The second capacitor is connected in parallel to the first capacitor. Therefore, the capacitance of the capacitor configured to filter out the interference signal transmitted on the first conducting wire and the second conducting wire can be further increased, and the interference caused to the function circuit by the interference signal transmitted on the first conducting wire and the second conducting wire can be further reduced.

In a possible implementation, the second parts of the first conducting wire are parallel to the fifth parts of the second conducting wire.

According to the foregoing solution, the second parts of the first conducting wire and the fifth parts of the second conducting wire are disposed in parallel, and this can further increase the area in which the first conducting wire and the second conducting wire are directly opposite to each other, and further increase the capacitance of the capacitor formed by the first conducting wire and the second conducting wire. In addition, a distance between the second part of the first conducting wire and the fifth part of the second conducting wire is minimized to further increase the capacitance of the second capacitor formed by the first conducting wire and the second conducting wire, and increase densities of the first conducting wire and the second conducting wire in the laminated structure, thereby improving die crack detection sensitivity.

In a possible implementation, to improve accuracy of a die crack detection result, a resistance of the first conducting wire is greater than or equal to N times a resistance of the second conducting wire, or the resistance of the first conducting wire is less than or equal to N times the resistance of the second conducting wire, and N is greater than or equal to 2.

In a possible implementation, a first resistor and a second resistor are further formed at the front-end-of-line device layer. The second end of the first conducting wire is connected to a first end of the first resistor, a second end of the first resistor is connected to a first end of the second resistor, and a second end of the second resistor is connected to the first end of the second conducting wire. The detection interface is disposed on a connection line between the second end of the first resistor and the first end of the second resistor.

In a possible implementation, to improve accuracy of a die crack detection result, a resistance of the first resistor is greater than or equal to N times a resistance of the second resistor, or the resistance of the first resistor is less than or equal to N times the resistance of the second resistor, and N is greater than or equal to 2.

In a possible implementation, the laminated structure includes at least three stacked metal layers. The conducting wire L is a serpentine wiring structure, and includes a first part, second parts, and a third part. The first part is located at a first metal layer, and is configured to connect two second parts adjacent to the first part. The second parts are located at another metal layer other than the first metal layer and a second metal layer. The third part is located at the second metal layer, and is configured to connect two second parts adjacent to the third part. The first metal layer is a bottom metal layer in the laminated structure, that is, a metal layer in the laminated structure that is adjacent to the front-end-of-line device layer. The second metal layer is a top metal layer in the laminated structure, that is, a metal layer in the laminated structure that is farthest from the front-end-of-line device layer. In other words, the first part, the second parts, and the third part are connected to each other in the laminated structure to form the conducting wire. Two adjacent second parts are paralleled to further increase an area in which the two adjacent second parts in the conducting wire are directly opposite to each other, and further increase a capacitance of a capacitor formed by the two adjacent second parts in the conducting wire.

In a possible implementation, parts in the second part that are located at two adjacent metal layers are staggered in a thickness direction of the laminated structure, to further increase the area in which the two adjacent second parts in the conducting wire are directly opposite to each other, and further increase the capacitance of the capacitor formed by the two adjacent second parts in the conducting wire.

In a possible implementation, the detection interface includes a first detection interface, and the first detection interface is configured to measure a voltage between the first detection interface and the first end of the first conducting wire, and measure a voltage between the first detection interface and the second end of the second conducting wire.

In a possible implementation, the detection interface further includes a second detection interface, and the second detection interface is configured to connect to a digital die crack detection circuit. The second detection interface may be a Joint Test Action Group (JTAG) interface.

In a possible implementation, the digital die crack detection circuit is disposed in the function circuit. The digital die crack detection circuit may be a phase inverter.

According to the foregoing solution, a metal pad (pad) used for a circuit test is usually disposed in the function detection circuit. In this case, there is no need to dispose a pad corresponding to the second detection interface in the die crack detection module, but only a need to connect, by using a conducting wire, the second detection interface to the pad used for a circuit test in the function circuit.

In a possible implementation, the chip crack detection apparatus further includes a seal ring, where the seal ring surrounds an outer side of the die crack detection module, and is configured to protect the function circuit and the die crack detection module.

DESCRIPTION OF EMBODIMENTS

To detect whether a die crack occurs in a chip, especially at a trial production stage of the chip, a die crack detection module is usually disposed around a function circuit (function circuit) in the chip. However, the die crack detection module also transmits, to the function circuit, an interference signal generated by the die crack detection module and an interference signal externally coupled to the die crack detection module, and this causes interference to the function circuit.

Figure 1:
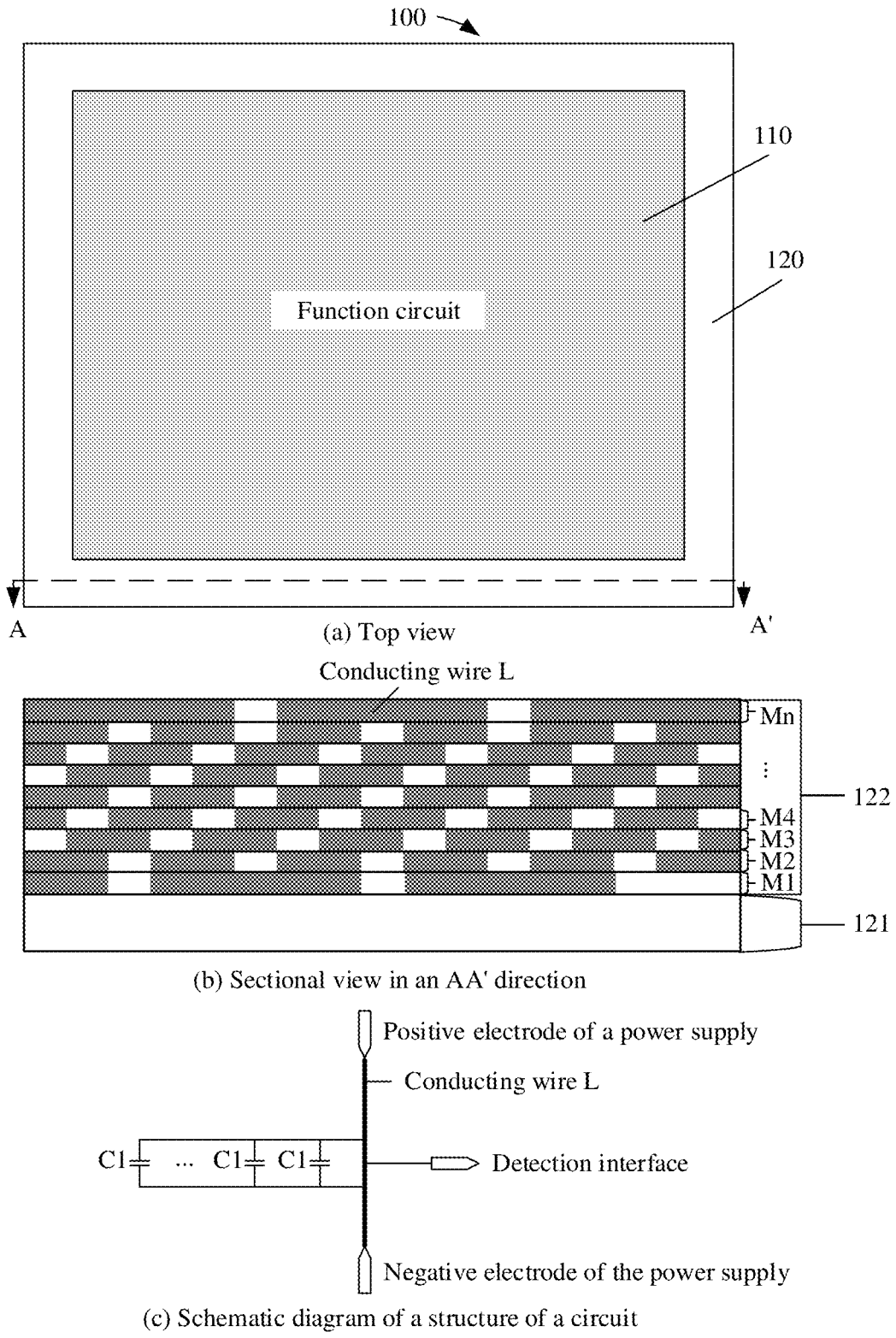
FIG. 1 is schematic diagram 1 of a structure of a chip crack detection apparatus according to an embodiment of this application.

To resolve the foregoing problem, this application provides a chip crack detection apparatus. The apparatus may be a chip, or may be a device, such as a mobile phone. FIG. 1 is a schematic diagram of a chip crack detection apparatus according to an embodiment of this application. Referring to FIG. 1, a chip crack detection apparatus 100 includes a function circuit 110 and a die crack detection module 120 (as shown in a top view in FIG. 1(a)) located surrounding the function circuit 110. The function circuit 110 may be an integrated circuit having a specific function, such as a processor, a memory, or an analog-to-digital converter, and refers to a function circuit configured to implement a normal function of a chip, for example, a function circuit configured to implement baseband signal processing in a baseband chip, or a function circuit configured to implement system control or computing in a system chip.

As shown in a sectional view in an AA' direction of the chip crack detection apparatus 100 in FIG. 1(b), the die crack detection module 120 includes a front-end-of-line device layer 121 and a laminated structure 122 (the laminated structure 122 includes n layers of M1, M2, M3, . . . , and Mn) disposed on the front-end-of-line device layer 121. The front-end-of-line device layer is a device layer of electronic devices that is prepared and formed on a semiconductor (such as silicon Si) substrate by using a semiconductor processing process (ion injection or the like), and includes the semiconductor substrate and devices prepared on the semiconductor substrate. A conducting wire L is formed in the laminated structure 122, and one or more first capacitors C1 are formed at the front-end-of-line device layer 121. A first end of the conducting wire L is configured to connect to a positive electrode of a power supply, and a second end of the conducting wire L is configured to connect to a negative electrode of the power supply. The first capacitor C1 is connected in parallel between the first end of the conducting wire L and the second end of the conducting wire L. A detection interface is disposed between the first end and the second end of the conducting wire L, and the detection interface is configured to detect whether a die crack occurs in the chip. A schematic diagram of a structure of an equivalent circuit of the die crack detection module 120 is shown in FIG. 1(c). The negative electrode of the power supply may be a common ground terminal (GND) of the circuit or a negative electrode of a bipolar power supply.

It may be learned from the equivalent circuit of the die crack detection module 120 shown in FIG. 1(c) that, the first capacitor C1 connected in parallel between the first end and the second end of the conducting wire L can guide, by using the second end of the conducting wire L, an interference signal transmitted on the conducting wire L (including an interference signal generated by the die crack detection module 120 and an interference signal coupled to the conducting wire L) into the ground or into another path that does not affect the function circuit. This reduces impact of the interference signal transmitted on the conducting wire L on the function circuit 110.

In specific implementation, the conducting wire L in the laminated structure 122 may be a complete conducting wire surrounding the function circuit 110 by one circle, or may be several conducting wires surrounding the function circuit 110 by one circle. For example, as shown in FIG. 1(a), when the function circuit 110 is rectangular, the conducting wire L in the laminated structure 122 may include four conducting wires in the laminated structure 122 that are respectively located on edges of four sides of the function circuit 110.

It should be noted that, capacitances of the plurality of first capacitors C1 in the front-end-of-line device layer 121 are not limited in this application, and may be the same or different.

Figure 2:
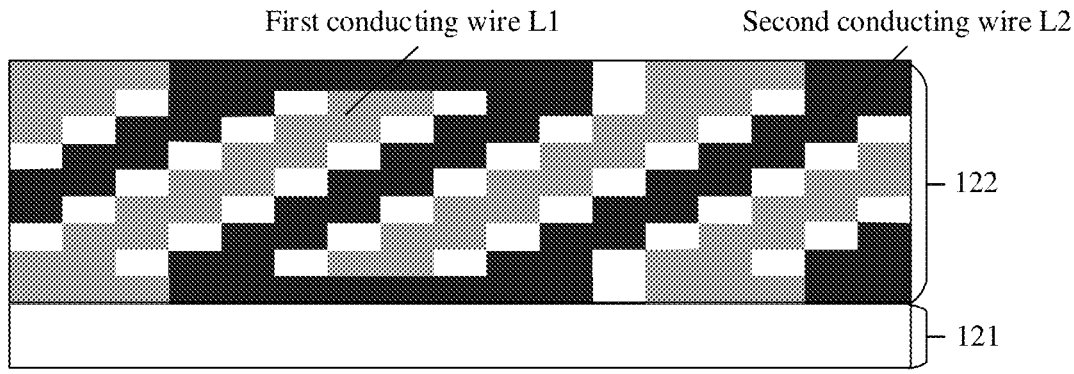
FIG. 2 is schematic diagram 1 of a structure of a die crack detection module according to an embodiment of this application.
Figure 2:
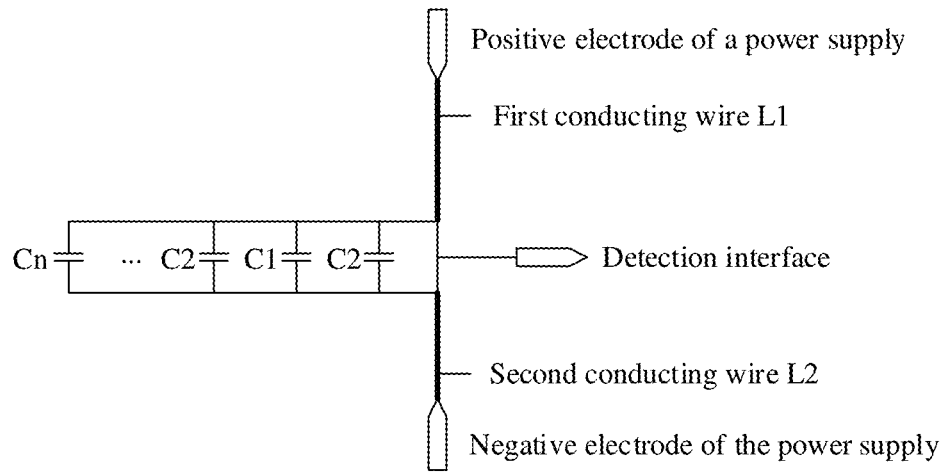

Further, as shown in FIG. 2, the conducting wire L may include a first conducting wire L1 and a second conducting wire L2, the first conducting wire L1 and the second conducting wire L2 both extend along a length direction of the laminated structure 122, the first conducting wire L1 covers a thickness direction of the laminated structure 122 and a width direction of the laminated structure 122, and the second conducting wire L2 covers the thickness direction of the laminated structure 122 and the width direction of the laminated structure 122; and the first conducting wire L1 and the second conducting wire L2 form a second capacitor C2. A first end of the first conducting wire L1 is configured to connect to the positive electrode of the power supply, a second end of the first conducting wire L1 is connected to a first end of the second conducting wire L2, a second end of the second conducting wire L2 is configured to connect to the negative electrode of the power supply, and the detection interface is disposed on a connection line between the second end of the first conducting wire L1 and the first end of the second conducting wire L2. The second capacitor C2 is connected in parallel to the first capacitor C1. This can increase a capacitance of a capacitor configured to filter out an interference signal transmitted on the first conducting wire L1 and the second conducting wire L2, and further reduce interference caused to the function circuit 110 by the interference signal transmitted on the first conducting wire L1 and the second conducting wire L2.

It should be noted that, the capacitor C2 shown in FIG. 2 is a second capacitor formed by the first conducting wire L1 and the second conducting wire L2, but not a capacitor that is additionally connected in parallel between the second end of the first conducting wire L1 and the first end of the second conducting wire L2.

Figure 3:
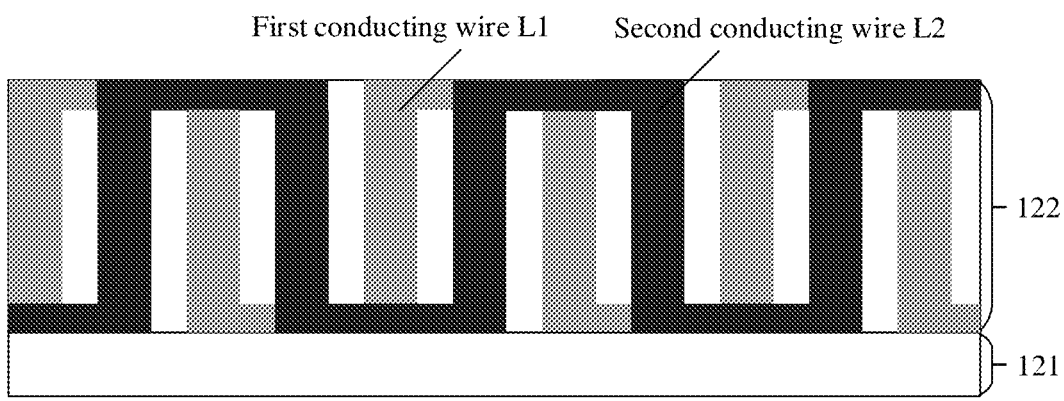
FIG. 3 is a schematic sectional view of a die crack detection module according to an embodiment of this application.

In specific implementation, to enable the first conducting wire L1 and the second conducting wire L2 to form the second capacitor C2, the first conducting wire L1 and the second conducting wire L2 are alternately distributed and spaced from each other in the extension direction of the first conducting wire L1 and the second conducting wire L2. For example, as shown in FIG. 2(1), cross sections of the first conducting wire L1 and the second conducting wire L2 in the thickness direction of the laminated structure 122 are step-shaped. Alternatively, as shown in FIG. 3, cross sections of the first conducting wire L1 and the second conducting wire L2 in the thickness direction of the laminated structure 122 are rectangular.

Figure 4A:
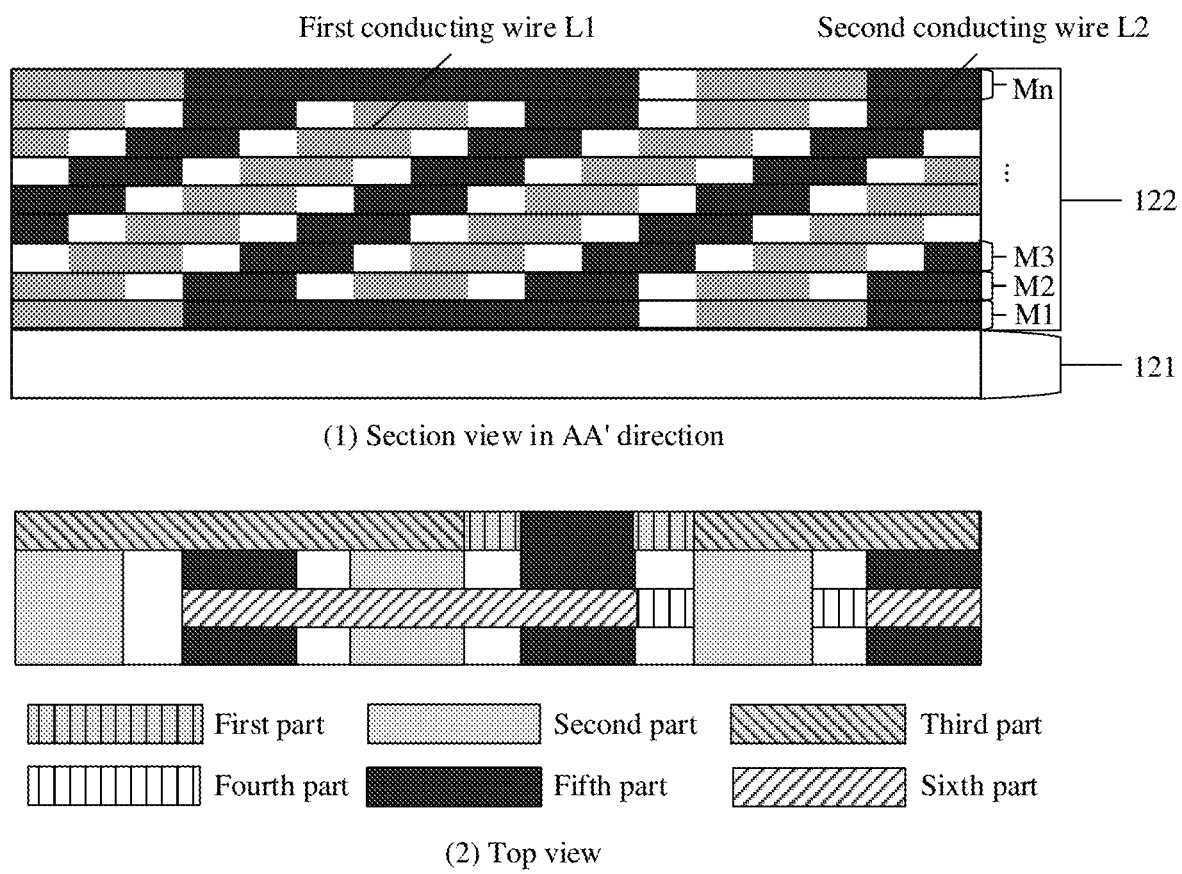
FIG. 4a is schematic diagram 2 of a structure of a die crack detection module according to an embodiment of this application.

Specifically, in a possible implementation, as shown in FIG. 4a, the laminated structure 122 includes at least three stacked metal layers (for example, n layers of M1, M2, M3, . . . , and Mn). The first conducting wire L1 is a serpentine wiring structure, and includes a first part, second parts, and a third part. The first part is located at a first metal layer, and is configured to connect two second parts adjacent to the first part. The second parts are located at another metal layer other than the first metal layer and a second metal layer. The third part is located at the second metal layer, and is configured to connect two second parts adjacent to the third part. The first metal layer is a bottom metal layer in the laminated structure 122, that is, a metal layer in the laminated structure 122 that is adjacent to the front-end-of-line device layer 121. The second metal layer is a top metal layer in the laminated structure 122, that is, a metal layer in the laminated structure 122 that is farthest from the front-end-of-line device layer 121. In other words, the first part, the second parts, and the third part are connected to each other in the laminated structure 122 to form the first conducting wire L1. The second conducting wire L2 is also a serpentine wiring structure, and includes a fourth part, fifth parts, and a sixth part. The fourth part is located at the first metal layer, and is configured to connect two fifth parts adjacent to the fourth part. The fifth parts are located at another metal layer other than the first metal layer and the second metal layer. The sixth part is located at the second metal layer, and is configured to connect two fifth parts adjacent to the sixth part. In other words, the fourth part, the fifth parts, and the sixth part are connected to each other in the laminated structure 122 to form the second conducting wire L2.

The second parts and the fifth parts are alternately distributed and spaced from each other in the laminated structure 122 in the extension direction of the first conducting wire L1 and the second conducting wire L2, the first part does not intersect the fourth part, and the third part does not intersect the sixth part (the first conducting wire L1 does not intersect the second conducting wire L2), so that the first conducting wire L1 and the second conducting wire L2 form the second capacitor C2. Parts of the first conducting wire L1 that are located at adjacent metal layers may be electrically connected by using a metal via, and parts of the second conducting wire L2 that are located at adjacent metal layers may be electrically connected by using a metal via (via), as shown in FIG. 4b.

Figure 4B:
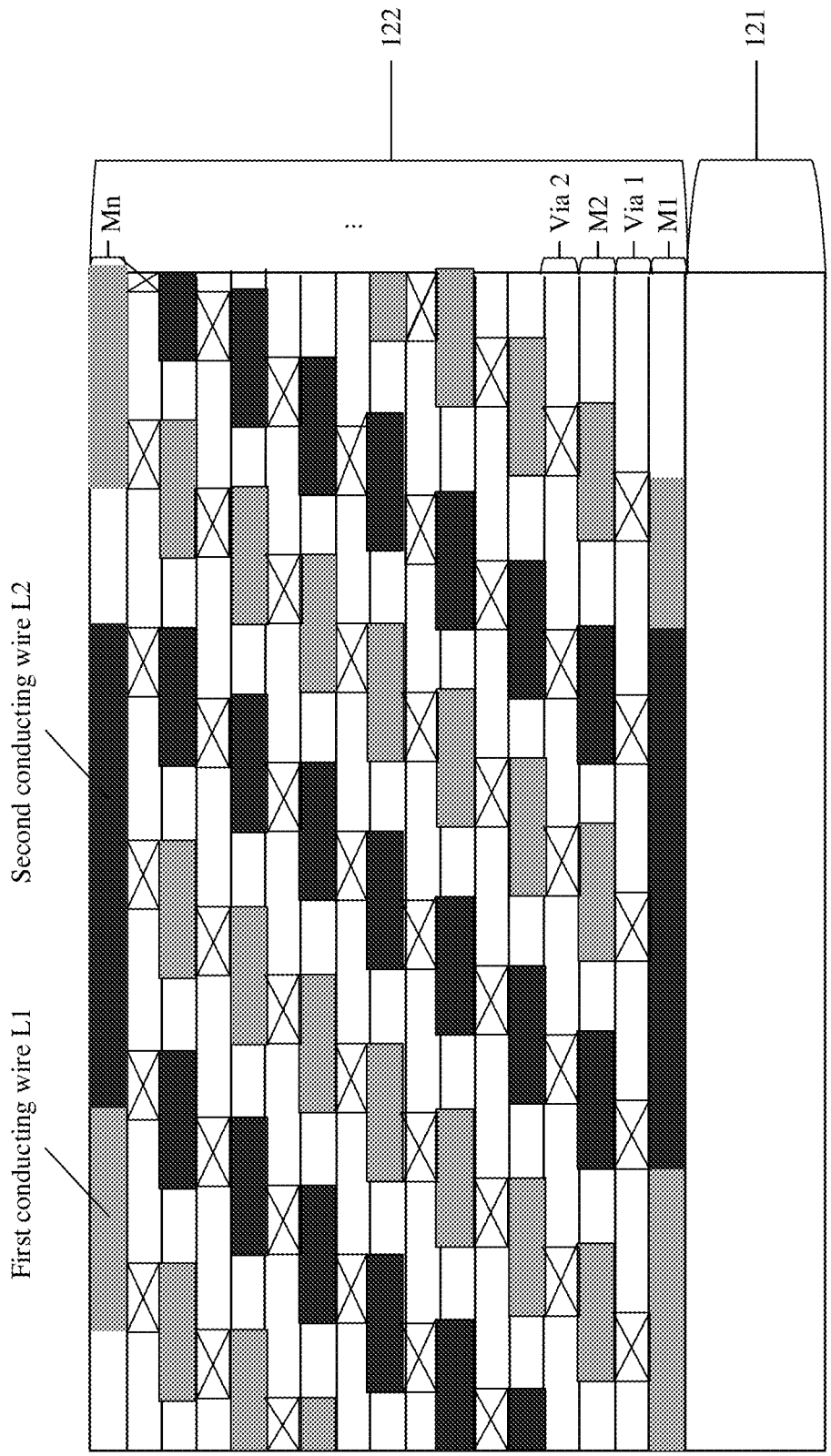
FIG. 4b is schematic diagram 3 of a structure of a die crack detection module according to an embodiment of this application.
Figure 4C:
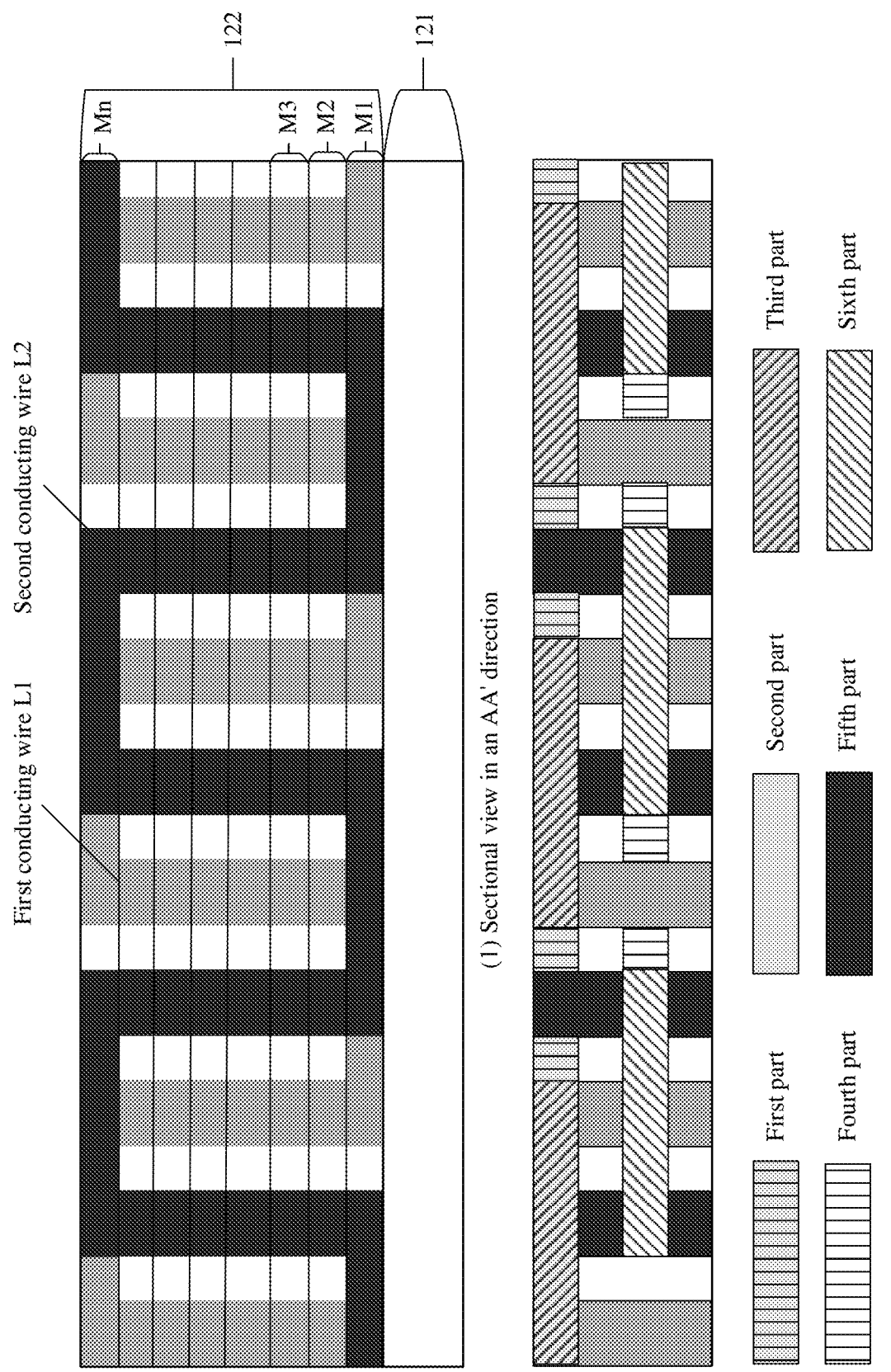
FIG. 4c is schematic diagram 4 of a structure of a die crack detection module according to an embodiment of this application.

It should be noted that, in FIG. 4a and FIG. 4b, a description is provided by using only an example in which cross sections of the first conducting wire L1 and the second conducting wire L2 in the thickness direction of the laminated structure 122 are step-shaped, and no limitation is imposed on this application. The cross sections of the first conducting wire L1 and the second conducting wire L2 in the thickness direction of the laminated structure 122 may alternatively be in another shape such as a rectangle, as shown in FIG. 4c.

Further, to increase a capacitance of the capacitor C2 formed by the first conducting wire L1 and the second conducting wire L2, as shown in FIG. 4a, parts in the second part of the first conducting wire L1 that are located at two adjacent metal layers are staggered in the thickness direction of the laminated structure 122, and parts in the fifth part of the second conducting wire L2 that are located at two adjacent metal layers are staggered in the thickness direction of the laminated structure 122. In this case, cross sections of the first part of the first conducting wire L1 and the fifth part of the second conducting wire L2 in the thickness direction of the laminated structure 122 are step-shaped.

Because the parts in the second part of the first conducting wire L1 that are located at two adjacent metal layers are staggered in the thickness direction of the laminated structure 122, and the parts in the fifth part of the second conducting wire L2 that are located at two adjacent metal layers are staggered in the thickness direction of the laminated structure 122, an area in which the first conducting wire L1 and the second conducting wire L2 are directly opposite to each other can be increased, and the capacitance of the capacitor C2 formed by the first conducting wire L1 and the second conducting wire L2 can be further increased. The second capacitor C2 is connected in parallel to the first capacitor C1. Therefore, the capacitance of the capacitor configured to filter out the interference signal transmitted on the first conducting wire and the second conducting wire can be further increased, and the interference caused to the function circuit 110 by the interference signal transmitted on the first conducting wire and the second conducting wire can be further reduced.

Further, the second parts of the first conducting wire L1 and the fifth parts of the second conducting wire L2 are parallel to each other, to further increase the area in which the first conducting wire L1 and the second conducting wire L2 are directly opposite to each other, and further increase the capacitance of the capacitor C2 formed by the first conducting wire L1 and the second conducting wire L2. In addition, a distance between the second part of the first conducting wire L1 and the fifth part of the second conducting wire L2 is minimized to further increase the capacitance of the second capacitor C2 formed by the first conducting wire L1 and the second conducting wire L2, and increase densities of the first conducting wire L1 and the second conducting wire L2 in the laminated structure 122, thereby improving die crack detection sensitivity.

Figure 4D:
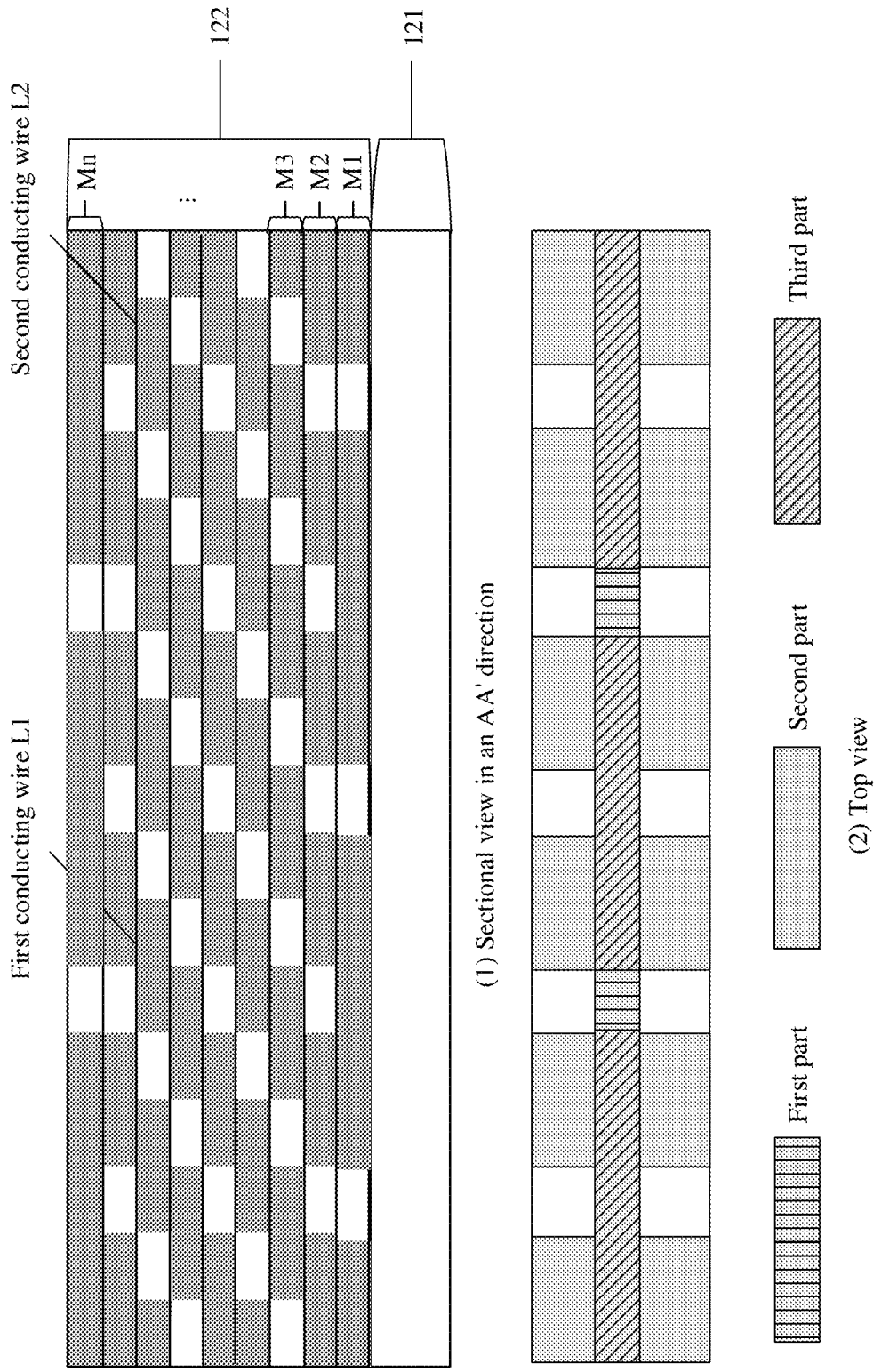
FIG. 4d is schematic diagram 5 of a structure of a die crack detection module according to an embodiment of this application.

In another possible implementation, as shown in FIG. 4d, the laminated structure 122 includes at least three stacked metal layers. The conducting wire L is a serpentine wiring structure, and includes a first part, second parts, and a third part. The first part is located at a first metal layer, and is configured to connect two second parts adjacent to the first part. The second parts are located at another metal layer other than the first metal layer and a second metal layer. The third part is located at the second metal layer, and is configured to connect two second parts adjacent to the third part. The first metal layer is a bottom metal layer in the laminated structure 122, that is, a metal layer in the laminated structure 122 that is adjacent to the front-end-of-line device layer 121. The second metal layer is a top metal layer in the laminated structure 122, that is, a metal layer in the laminated structure 122 that is farthest from the front-end-of-line device layer 121. In other words, the first part, the second parts, and the third part are connected to each other in the laminated structure 122 to form the conducting wire L. Two adjacent second parts are parallel to further increase an area in which the two adjacent second parts in the conducting wire L are directly opposite to each other, and further increase a capacitance of a capacitor formed by the two adjacent second parts in the conducting wire L.

Figure 4E:
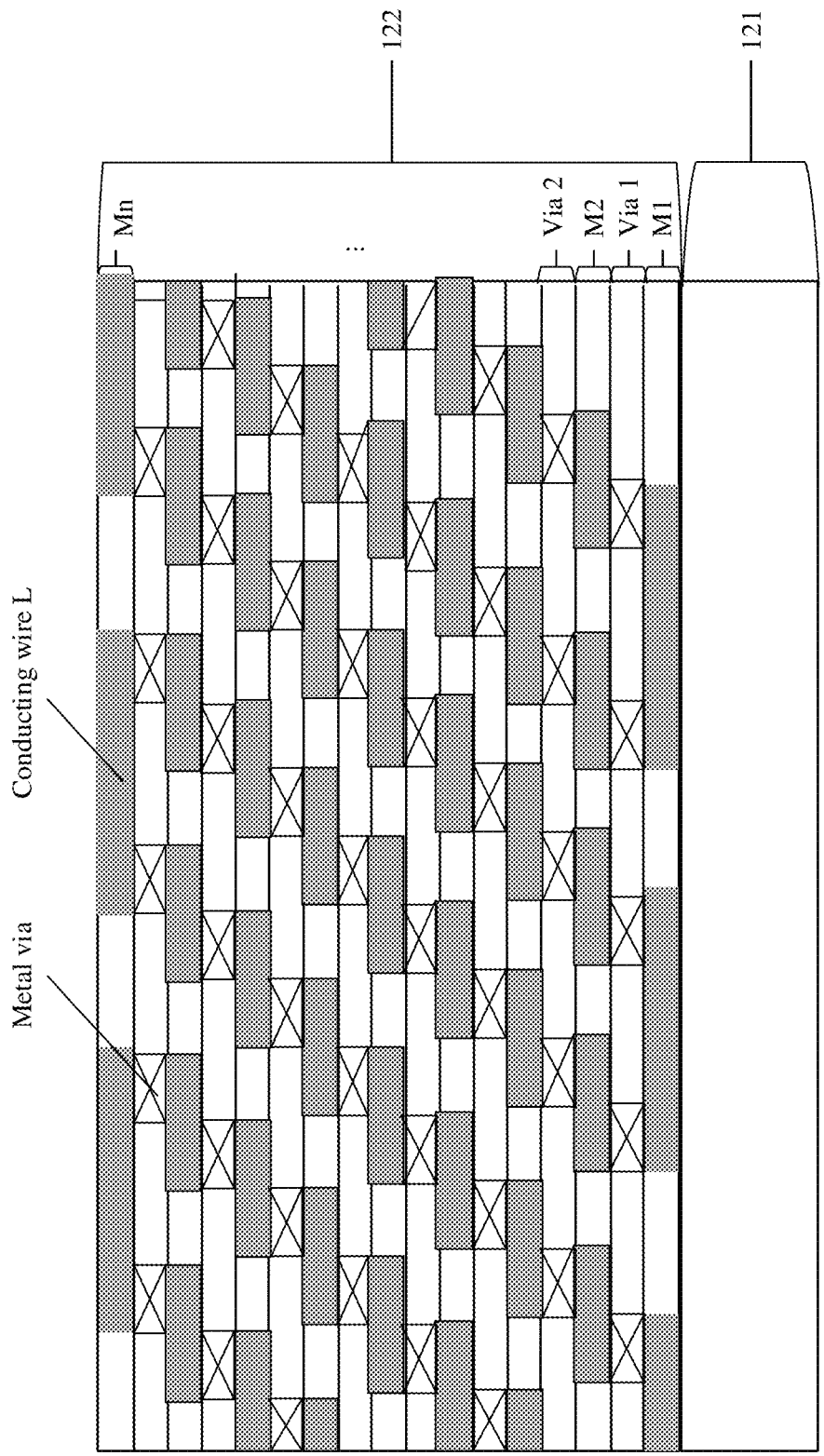
FIG. 4e is schematic diagram 6 of a structure of a die crack detection module according to an embodiment of this application.

Parts of the conducting wire L that are located at adjacent metal layers may be electrically connected by using a metal via (via), as shown in FIG. 4e.

Further, to increase the area in which the two adjacent second parts in the conducting wire L are directly opposite to each other, and further increase the capacitance of the capacitor formed by the two adjacent second parts in the conducting wire L, the parts in the second part of the conducting wire L that are located at two adjacent metal layers are staggered in the thickness direction of the laminated structure 122.

In addition, a distance between the two adjacent second parts in the conducting wire L is minimized to further increase the capacitance of the capacitor formed by the two adjacent second parts in the conducting wire L, and increase a density of the conducting wire L in the laminated structure 122, thereby improving die crack detection sensitivity.

In this embodiment of this application, whether a die crack occurs in the chip may be determined by detecting a voltage V1 between the detection port and a first port of the conducting wire L1 and a voltage V2 between the detection port and a first port of the conducting wire L2 in the die crack detection module 120. In this case, the detection interface includes a first detection interface, and the first detection interface is configured to measure a voltage between the first detection interface and the first end of the first conducting wire, and measure a voltage between the first detection interface and the second end of the second conducting wire.

When a die crack occurs in the chip, at least one of the first conducting wire L1 and the second conducting wire L2 is disconnected. When no die crack occurs in the chip, neither the first conducting wire L1 nor the second conducting wire L2 is disconnected. As shown in FIG. 2, in a scenario in which a resistance of the first conducting wire L1 is $R_{L1}$, a resistance of the second conducting wire L2 is $R_{L2}$, a voltage of a power supply connected to the first end of the first conducting wire L1 is VDD, and the second end of the second conducting wire L2 is grounded: if both the first conducting wire L1 and the second conducting wire L2 are disconnected, that is, a die crack occurs in the chip, an open (open) state exists between the first detection port and the first port of the first conducting wire L1, and the open state also exists between the first detection port and the second port of the second conducting wire L2; if neither the first conducting wire L1 nor the second conducting wire L2 is disconnected, that is, no die crack occurs in the chip, the voltage V1 between the first detection port and the first port of the first conducting wire L1 is equal to $$\frac{R_{L1}}{R_{L1}+R_{L2}}VDD,$$

and the voltage V2 between the first detection port and the second port of the second conducting wire L2 is equal to $$\frac{R_{L2}}{R_{L1}+R_{L2}}VDD,$$

where when $R_{L1}$ is far greater than $R_{L2}$, the voltage V1 between the first detection port and the first port of the first conducting wire L1 is approximately VDD, and the voltage V2 between the first detection port and the second port of the second conducting wire L2 is approximately 0; if the first conducting wire L1 is disconnected but the second conducting wire L2 is not disconnected, that is, a die crack occurs in the chip, the open state exists between the first detection port and the first port of the first conducting wire L1, and the voltage V2 between the first detection port and the second port of the second conducting wire L2 is 0; or if the first conducting wire L1 is not disconnected but the second conducting wire L2 is disconnected, that is, a die crack occurs in the chip, the voltage V1 between the first detection port and the first port of the first conducting wire L1 is 0, and the open state exists for the voltage V2 between the first detection port and the second port of the second conducting wire L2.

In other words, when the voltage V1 between the first detection port and the first port of the first conducting wire L1 is equal to $$\frac{R_{L1}}{R_{L1}+R_{L2}}VDD,$$

and the voltage V2 between the first detection port and the second port of the second conducting wire L2 is equal to $$\frac{R_{L2}}{R_{L1}+R_{L2}}VDD,$$

no die crack occurs in the chip. When the voltage V1 between the first detection port and the first port of the first conducting wire L1 and the voltage V2 between the first detection port and the second port of the second conducting wire L2 are other values, a die crack occurs in the chip.

A detected voltage V1 between the first detection port and the first port of the first conducting wire L1 and a detected voltage V2 between the first detection port and the second port of the second conducting wire L2 usually have an error, which affects accuracy of a die crack detection result. Therefore, to improve the accuracy of a die crack detection result, a large difference usually exists between the resistance of the first conducting wire L1 and the resistance of the second conducting wire L2 in a specific implementation process, so that a large difference exists between the detected voltage V1 between the first detection port and the first port of the first conducting wire L1 and the detected voltage V2 between the first detection port and the second conducting wire L2.

Specifically, the resistance of the first conducting wire L1 is greater than or equal to N times the resistance of the second conducting wire L2, or the resistance of the first conducting wire L1 is less than or equal to N times the resistance of the second conducting wire L2, and N is greater than or equal to 2. In this way, a large difference exists between the voltage V1 between the detection port and the first port of the first conducting wire L1 and the voltage V2 between the detection port and the second port of the second conducting wire L2, thereby more accurately determining whether a die crack occurs in the chip.

The resistance of the first conducting wire L1 and the resistance of the second conducting wire L2 may be implemented by changing one or more of the following parameters of the first conducting wire L1 and the second conducting wire L2: a material of the conducting wire (different materials of the conducting wire have different resistivities), a length of the conducting wire, a cross-sectional area of the conducting wire, and the like.

Figure 5:
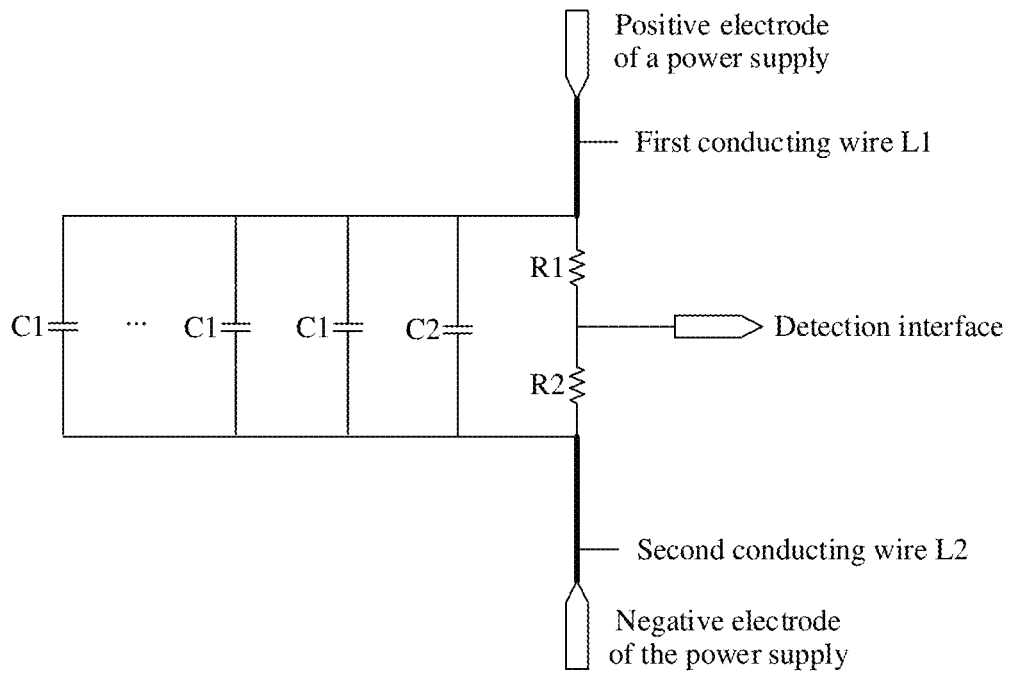
FIG. 5 is a schematic diagram of a structure of a circuit corresponding to a die crack detection module according to an embodiment of this application.

In addition to determining whether a die crack occurs in the chip by detecting the voltage V1 between the detection port and the first port of the first conducting wire L1 and the voltage V2 between the detection port and a first port of the second conducting wire L2 in the die crack detection module 120 by using the resistance of the first conducting wire L1 and the resistance of the second conducting wire L2 for voltage division, a manner of connecting a voltage divider resistor in series between the second end of the first conducting wire L1 and the first end of second conducting wire L2 may be used to detect the voltage V1 between the detection port and the first port of the first conducting wire L1 and the voltage V2 between the detection port and the first port of the second conducting wire L2 in the die crack detection module 120, so as to determine whether a die crack occurs in the chip. As shown in FIG. 5, a first resistor R1 and a second resistor R2 are further formed at the front-end-of-line device layer 121. The second end of the first conducting wire L1 is connected to a first end of the first resistor R1, a second end of the first resistor R1 is connected to a first end of the second resistor R2, and a second end of the second resistor R2 is connected to the first end of the second conducting wire L2; and the detection interface is disposed on a connection line between the second end of the first resistor R1 and the first end of the second resistor R2. When the resistor R1 and the resistor R2 are connected between the first conducting wire L1 and the second conducting wire L2, the resistance of the first conducting wire L1 and the resistance of the second conducting wire L2 are usually configured to be small, to reduce power consumption of the die crack detection module 120.

As shown in FIG. 5, when a die crack occurs in the chip, at least one of the first conducting wire L1 and the second conducting wire L2 is disconnected; or when no die crack occurs in the chip, neither the first conducting wire L1 nor the second conducting wire L2 is disconnected. In a scenario in which the resistance of the first resistor R1 is $R_1$, the resistance of the second resistor R2 is $R_2$ (compared with the resistance of the first resistor R1 and the resistance of the second resistor R2, the resistance of the first conducting wire L1 and the resistance of the second conducting wire L2 may be ignored), a voltage of a power supply connected to the first end of the first conducting wire L1 is VDD, and the second end of the second conducting wire L2 is grounded: if both the first conducting wire L1 and the second conducting wire L2 are disconnected, that is, a die crack occurs in the chip, an open state exists between the first detection port and the first port of the first conducting wire L1, and the open state also exists between the first detection port and the second port of the second conducting wire L2; if neither the first conducting wire L1 nor the second conducting wire L2 is disconnected, that is, no die crack occurs in the chip, the voltage V1 between the first detection port and the first port of the first conducting wire L1 is equal to $$\frac{R_1}{R_1 + R_2} VDD,$$

and the voltage V2 between the first detection port and the second port of the second conducting wire L2 is equal to $$\frac{R_2}{R_1 + R_2} VDD,$$

where when $R_1$ is far less than $R_2$, the voltage V1 between the first detection port and the first port of the first conducting wire L1 is approximately equal to 0, and the voltage V2 between the first detection port and the second port of the second conducting wire L2 is approximately equal to VDD; if the first conducting wire L1 is disconnected but the second conducting wire L2 is not disconnected, that is, a die crack occurs in the chip, the open state exists between the first detection port and the first port of the first conducting wire L1, and the voltage V2 between the first detection port and the second port of the second conducting wire L2 is 0; or if the first conducting wire L1 is not disconnected but the second conducting wire L2 is disconnected, that is, a die crack occurs in the chip, the voltage V1 between the first detection port and the first port of the first conducting wire L1 is 0, and the open state exists between the first detection port and the second port of the second conducting wire L2.

In other words, when the voltage V1 between the first detection port and the first port of the first conducting wire L1 is equal to $$\frac{R_1}{R_1 + R_2} VDD,$$

and the voltage V2 between the first detection port and the second port of the second conducting wire L2 is equal to $$\frac{R_2}{R_1 + R_2} VDD,$$

no die crack occurs in the chip. When the voltage V1 between the first detection port and the first port of the first conducting wire L1 and the voltage V2 between the first detection port and the second port of the second conducting wire L2 are other values, a die crack occurs in the chip.

A detected voltage V1 between the first detection port and the first port of the first conducting wire L1 and a detected voltage V2 between the first detection port and the second port of the second conducting wire L2 usually have an error, which affects accuracy of a die crack detection result. Therefore, to improve the accuracy of a die crack detection result, a large difference usually exists between the resistance of the first resistor R1 and the resistance of the second resistor R2 in a specific implementation process, so that a large difference exists between the detected voltage V1 between the first detection port and the first port of the first conducting wire L1 and the detected voltage V2 between the first detection port and the second conducting wire L2. Further, the resistance of the first resistor R1 is greater than or equal to N times the resistance of the second resistor R2, or the resistance of the first resistor R1 is less than or equal to N times the second resistor R2, and N is greater than or equal to 2.

When whether a die crack occurs in the chip is determined by detecting the voltage V1 between the detection port and the first port of the first conducting wire L1 and the voltage V2 between the detection port and the first port of the second conducting wire L2 in the die crack detection module 120, the accuracy of a die crack detection result is greatly affected by precision of the detected voltage V1 between the detection port and the first port of the first conducting wire L1 and the detected voltage V2 between the detection port and the first port of the second conducting wire L2. To reduce impact of precision of a detected voltage on a die crack detection result and further improve the accuracy of a die crack detection result, the detection port may be connected to a digital die crack detection circuit, so that whether a die crack occurs in the chip is determined with reference to a detection result of the digital die crack detection circuit based on the detection of the voltage V1 between the detection port and the first port of the first conducting wire L1 and the voltage V2 between the detection port and the first port of the second conducting wire L2. In addition, an output result of the digital die crack detection circuit is more intuitive, so that a detection person determines whether a die crack occurs in the chip.

In this case, in addition to the first detection interface, the detection interface further includes a second detection interface configured to connect to the digital die crack detection circuit (such as a phase inverter). The digital die crack detection circuit may be located outside the chip, or may be located inside the chip, specifically, located in the function circuit 110. A metal pad (pad) used for a circuit test is usually disposed in the function detection circuit 110. In this case, there is no need to dispose a pad corresponding to the second detection interface in the die crack detection module 120, but only a need to connect, by using a conducting wire, the second detection interface to the pad used for a circuit test in the function circuit 110. Further, the second detection interface may be a Joint Test Action Group (Joint Test Action Group, JTAG) interface.

When whether a die crack occurs in the chip is detected with reference to the digital die crack detection circuit, it needs to be determined, based on a specific voltage value, whether a logical level in the digital die crack detection circuit is a high level or a low level. Therefore, when whether a die crack occurs in the chip is detected with reference to the digital die crack detection circuit, a large difference exists between the resistance of the first conducting wire L1 and the resistance of the second conducting wire L2, for example, the resistance of the first conducting wire L1 is greater than or equal to N times the resistance of the second conducting wire L2; or a large difference exists between the resistances of the first resistor R1 and the second resistor R2 that are connected between the first conducting wire L1 and the second conducting wire L2, for example, the resistance of the first resistor R1 is greater than or equal to N times the resistance of the second resistor R2, or the resistance of the first resistor R1 is less than or equal to N times the resistance of the second resistor R2. N is greater than or equal to 2, so that the digital die crack detection circuit differentiates between a high level and a low level.

Figure 6:
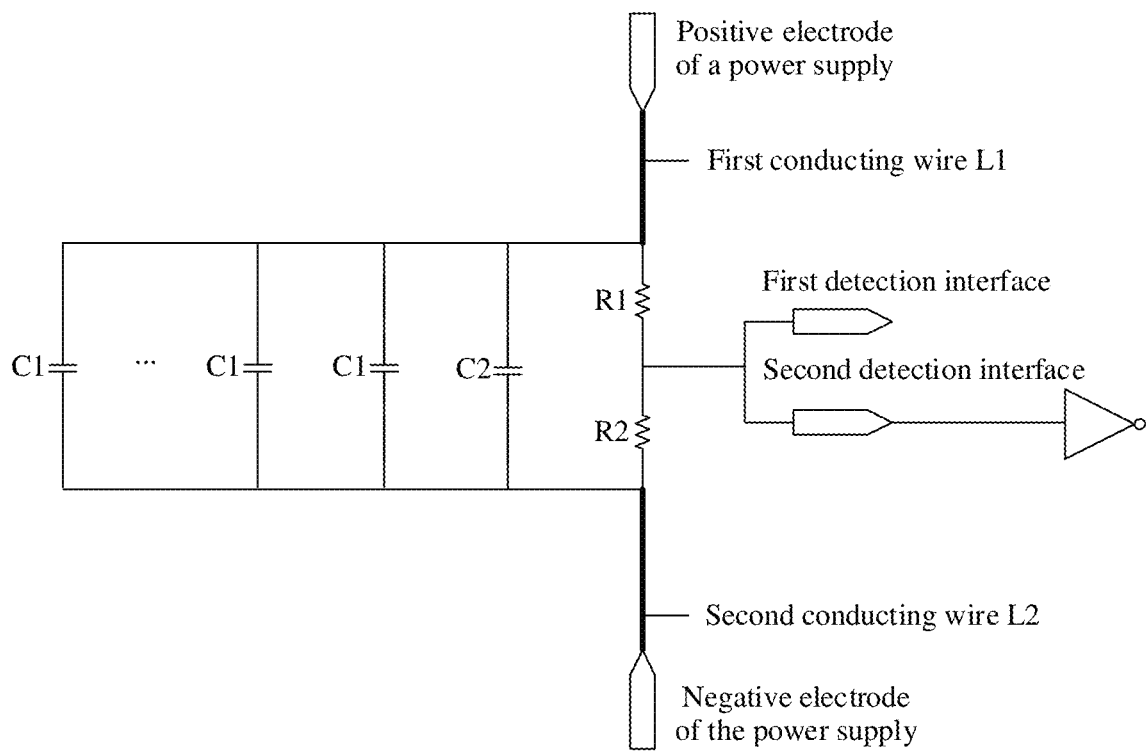
FIG. 6 is a schematic diagram of a structure of another circuit corresponding to a die crack detection module according to an embodiment of this application.

For example, as shown in FIG. 6, in a scenario in which the resistance of the first resistor R1 is far less than the resistance of the second resistor R2, a voltage of a power supply connected to the first end of the first conducting wire L1 is VDD, the second end of the second conducting wire L2 is grounded, and the second detection port is connected to a phase inverter: if both the first conducting wire L1 and the second conducting wire L2 are disconnected, that is, a die crack occurs in the chip, an open state exists between the first detection port and the first port of the first conducting wire L1, the open state exists between the first detection port and the second port of the second conducting wire L2, and an output of the phase inverter is in an uncertain state; if neither the first conducting wire L1 nor the second conducting wire L2 is disconnected, that is, no die crack occurs in the chip, the voltage V1 between the first detection port and the first port of the first conducting wire L1 is approximately equal to 0, the voltage V2 between the first detection port and the second port of the second conducting wire L2 is approximately VDD, and an output of the phase inverter is a low level, which may be represented by "0"; if the first conducting wire L1 is disconnected but the second conducting wire L2 is not disconnected, that is, a die crack occurs in the chip, the open state exists between the first detection port and the first port of the first conducting wire L1, the voltage V2 between the first detection port and the second port of the second conducting wire L2 is 0, and an output of the phase inverter is a high level, which may be represented by "1"; or if the first conducting wire L1 is not disconnected but the second conducting wire L2 is disconnected, that is, a die crack occurs in the chip, the voltage V1 between the first detection port and the first port of the first conducting wire L1 is 0, the open state exists between the first detection port and the second port of the second conducting wire L2, and an output of the phase inverter is a low level.

It may be learned from the foregoing example that, when the resistance of the first resistor R1 is less than the resistance of the second resistor R2, apart from the scenario in which both the first conducting wire L1 and the second conducting wire L2 are disconnected, an output result of the phase inverter cannot help distinguish between the scenario in which neither the first conducting wire L1 nor the second conducting wire L2 is disconnected and the scenario in which the first conducting line L1 is not disconnected but the second conducting wire L2 is disconnected. To solve this problem, a length of the first conducting wire L1 may be set to be far greater than a length of the second conducting wire, so that a probability that the second conducting wire is disconnected when a die crack occurs in the chip is small, that is, when a die crack occurs in the chip, the first conducting wire L1 is disconnected and the second conducting wire L2 is generally not disconnected. This is equivalent to that the case in which the first conducting line L1 is not disconnected but the second conducting line L2 is disconnected does not occur. In this case, whether a die crack occurs in the chip may be directly determined based on the output result of the phase inverter except in the scenario in which both the first conducting wire L1 and the second conducting wire L2 are disconnected, and there is no need to consider a specific value of the voltage V1 between the first detection port and the first port of the first conducting wire L1 and a specific value of the voltage V2 between the first detection port and the second port of the second conducting wire L2. In the scenario in which both the first conducting wire L1 and the second conducting wire L2 are disconnected, whether a die crack occurs in the chip may be finally determined with further reference to the voltage V1 between the first detection port and the first port of the first conducting wire L1 and the voltage V2 between the first detection port and the second port of the second conducting wire L2.

Likewise, when the resistance of the first resistor R1 is greater than the resistance of the second resistor R2, apart from the scenario in which both the first conducting wire L1 and the second conducting wire L2 are disconnected, an output result of the phase inverter cannot help distinguish between the scenario in which neither the first conducting wire L1 nor the second conducting wire L2 is disconnected and the scenario in which the first conducting line L1 is disconnected but the second conducting wire L2 is not disconnected. To solve this problem, a length of the first conducting wire L1 may be set to be far less than a length of the second conducting wire, so that a probability that the first conducting wire is disconnected when a die crack occurs in the chip is small, that is, when a die crack occurs in the chip, the first conducting wire L1 is generally not disconnected and the second conducting wire L2 is disconnected. This is equivalent to that the case in which the first conducting line L1 is disconnected but the second conducting line L2 is not disconnected does not occur. In this case, whether a die crack occurs in the chip may be directly determined based on the output result of the phase inverter except in the scenario in which both the first conducting wire L1 and the second conducting wire L2 are disconnected, and there is no need to consider a specific value of the voltage V1 between the first detection port and the first port of the first conducting wire L1 and a specific value of the voltage V2 between the first detection port and the second port of the second conducting wire L2. In the scenario in which both the first conducting wire L1 and the second conducting wire L2 are disconnected, whether a die crack occurs in the chip may be finally determined with further reference to the voltage V1 between the first detection port and the first port of the first conducting wire L1 and the voltage V2 between the first detection port and the second port of the second conducting wire L2.

Figure 7:
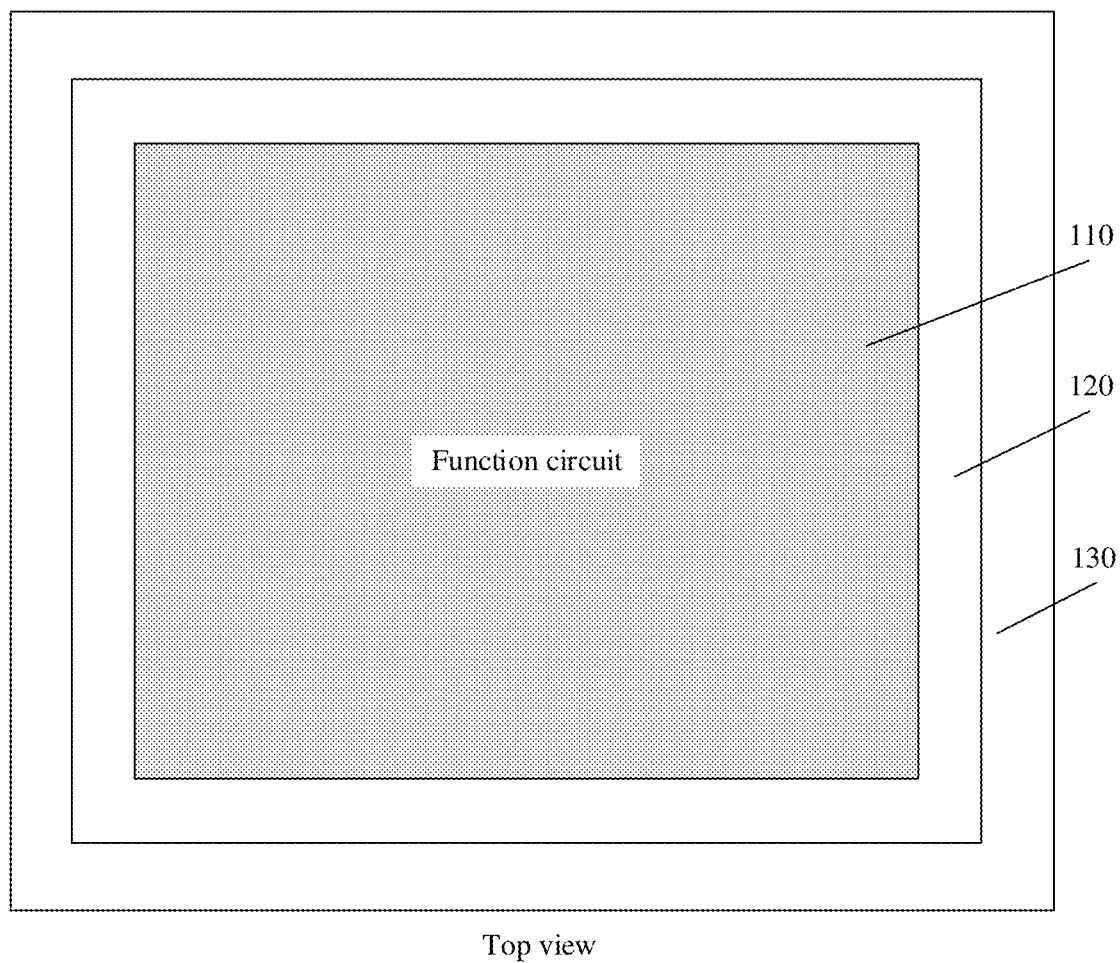
FIG. 7 is schematic diagram 2 of a structure of a chip crack detection apparatus according to an embodiment of this application.

Further, as shown in FIG. 7, the chip crack detection apparatus 100 may further include a seal ring (seal ring) 130, where the seal ring 130 surrounds an outer side of the die crack detection module 120, and is configured to protect the function circuit 110 and the die crack detection module 120.

Figure 8:
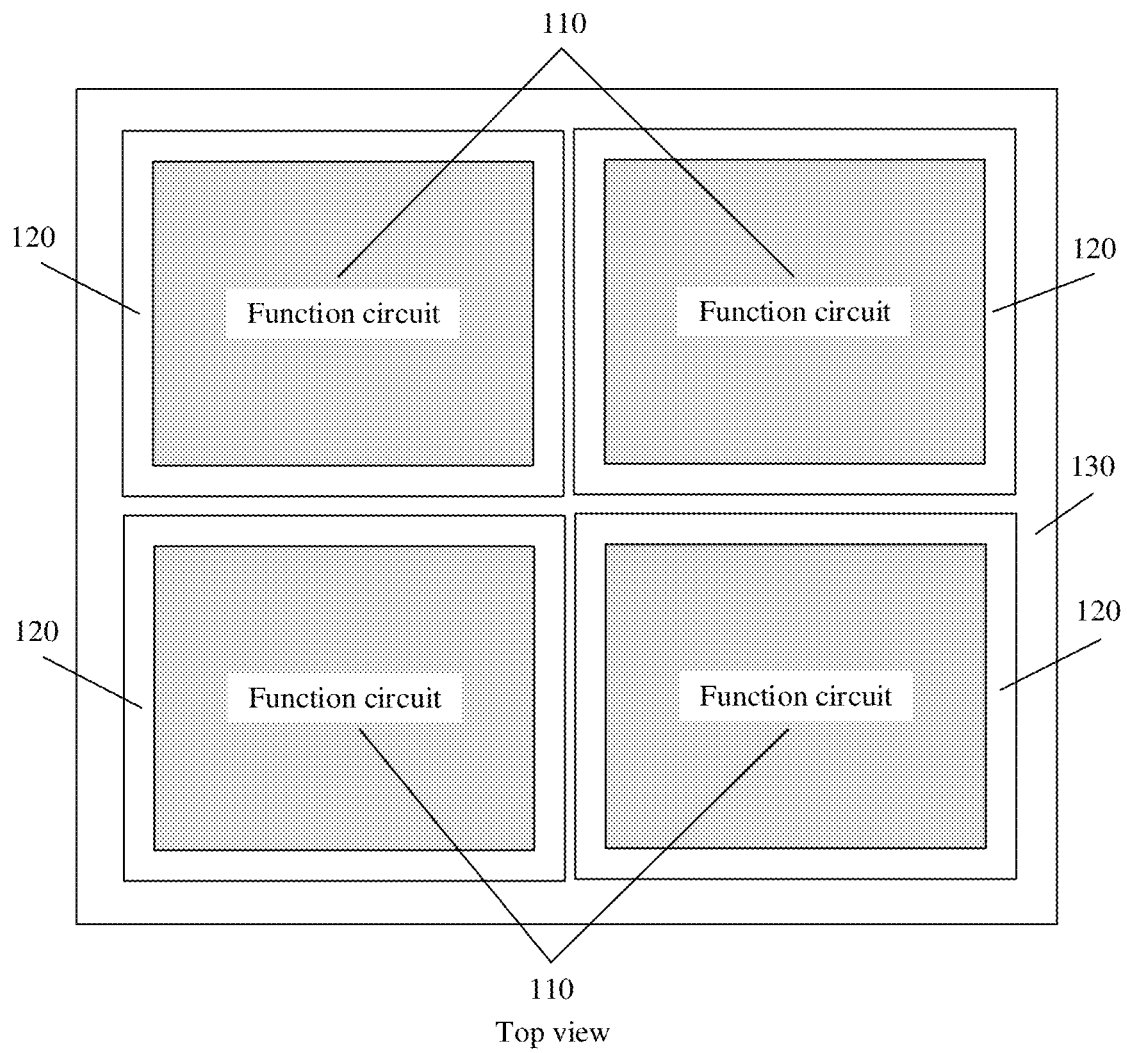
FIG. 8 is schematic diagram 3 of a structure of a chip crack detection apparatus according to an embodiment of this application.

When the chip crack detection apparatus 100 includes a plurality of function circuits 110, the die crack detection module 120 may be disposed around each function circuit 110. For example, as shown in FIG. 8, the chip crack detection apparatus 100 includes four function circuits 110, and the die crack detection module 120 is disposed around each of the four function circuits 110.

According to the foregoing solution, in this embodiment of this application, whether a die crack occurs in the function circuit 110 may be determined by detecting the voltage between the detection port and the first port of the conducting wire L and the voltage between the detection port and the second port of the conducting wire L in the die crack detection module 120. In addition, the first capacitor C1 connected in parallel between the first end and the second end of the conducting wire L can guide, by using the second end of the conducting wire L, an interference signal transmitted on the conducting wire L (including an interference signal generated by the die crack detection module 120 and an interference signal coupled to the conducting wire L) into the earth or into another path that does not affect the function circuit, thereby reducing impact of the interference signal transmitted on the conducting wire L on the function circuit 110.

That is, the die crack detection module 120 in the chip crack detection apparatus 100 provided in this embodiment of this application not only can implement die crack detection, but also can reduce the impact of the interference signal transmitted on the conducting wire L in the die crack detection module 120 on the function circuit 110.

Obviously, persons skilled in the art can make various modifications and variations to the embodiments of this application without departing from the scope of the embodiments of this application. This application is intended to cover these modifications and variations of the embodiments of this application provided that they fall within the scope of protection defined by the following claims and their equivalent technologies.

The invention claimed is:

1. A chip crack detection apparatus, comprising:
a function circuit; and
a die crack detection module surrounding the function circuit, the die crack detection module comprising:
a front-end-of-line device layer;
a laminated structure on the front-end-of-line device layer, the laminated structure including a conducting wire in the laminated structure;
a detection interface; and
a capacitor at the front-end-of-line device layer,
wherein
a first end of the conducting wire is configured to connect to a positive electrode of a power supply,
a second end of the conducting wire is configured to connect to a negative electrode of the power supply,
the capacitor is connected in parallel between the first end of the conducting wire and the second end of the conducting wire,
the detection interface is coupled with the conducting wire between the first end and the second end of the conducting wire, and
the detection interface is configured to detect whether a die crack occurs in the chip.

2. The apparatus according to claim 1, wherein
the conducting wire comprises a first conducting wire and a second conducting wire,
the capacitor is a first capacitor, and the die crack detection module further comprises a second capacitor formed by the first conducting wire and the second conducting wire,
the first conducting wire and the second conducting wire both extend along a length direction of the laminated structure, the first conducting wire covers a thickness direction of the laminated structure and a width direction of the laminated structure, the second conducting wire covers the thickness direction of the laminated structure and the width direction of the laminated structure, a first end of the first conducting wire is configured to connect to the positive electrode of the power supply, a second end of the first conducting wire is connected to a first end of the second conducting wire, a second end of the second conducting wire is configured to connect to the negative electrode of the power supply, and the detection interface is coupled with the conducting wire by way of a connection line connecting the second end of the first conducting wire and the first end of the second conducting wire.

3. The apparatus according to claim 2, wherein the first conducting wire and the second conducting wire are alternately distributed and spaced from each other in the length direction of the laminated structure.

4. The apparatus according to claim 3, wherein
the laminated structure comprises at least three stacked metal layers,
the first conducting wire is a serpentine wiring structure, and comprises a first part, second parts, and a third part, the first part is located at a first metal layer, and is configured to connect two second parts adjacent to the first part,
the first metal layer is in the laminated structure and is adjacent to the front-end-of-line device layer,
the second parts are located at another metal layer other than the first metal layer and a second metal layer,
the second metal layer is in the laminated structure and is farthest from the front-end-of-line device layer among other metal layers that are in the laminated structure,
the third part is at the second metal layer and is configured to connect two second parts adjacent to the third part,
the second conducting wire is a serpentine wiring structure, and comprises a fourth part, fifth parts, and a sixth part, the fourth part is at the first metal layer, and is configured to connect two fifth parts adjacent to the fourth parts,
the fifth parts are at another metal layer other than the first metal layer and the second metal layer,
the sixth part is located at the second metal layer and is configured to connect two fifth parts adjacent to the sixth part,
the second parts and the fifth parts are alternately distributed and spaced from each other in the length direction of the laminated structure,
the first part does not intersect the fourth part, and
the third part does not intersect the sixth part.

5. The apparatus according to claim 4, wherein
parts of the second part that are at two adjacent metal layers are staggered in the thickness direction of the laminated structure, and
parts of the fifth part that are at two adjacent metal layers are staggered in the thickness direction of the laminated structure.

6. The apparatus according to claim 4, wherein the second parts are parallel to the fifth parts.

7. The apparatus according to claim 2, wherein a resistance of the first conducting wire is greater than or equal to N times a resistance of the second conducting wire, and N is greater than or equal to 2.

8. The apparatus according to claim 2, wherein
the die crack detection module further comprises a first resistor and a second resistor at the front-end-of-line device layer,
the second end of the first conducting wire is connected to a first end of the first resistor,
a second end of the first resistor is connected to a first end of the second resistor,
a second end of the second resistor is connected to the first end of the second conducting wire,
the connection line connecting the second end of the first conducting wire and the first end of the second conducting wire is a first connection line connecting the second end of the first resistor to the first end of the second resistor, and
the detection interface is coupled with the first connection line by way of a second connection line connected to the first connection line between the second end of the first resistor and the first end of the second resistor.

9. The apparatus according to claim 8, wherein a resistance of the first resistor is greater than or equal to N times a resistance of the second resistor, and N is greater than or equal to 2.

10. The apparatus according to claim 8, wherein a resistance of the first resistor is less than or equal to N times a resistance of the second resistor, and N is greater than or equal to 2.

11. The apparatus according to claim 2, wherein a resistance of the first conducting wire is less than or equal to N times a resistance of the second conducting wire, and N is greater than or equal to 2.

12. The apparatus according to claim 1, wherein
the laminated structure comprises at least three stacked metal layers,
the conducting wire is a serpentine wiring structure, and comprises a first part, second parts, and a third part, the first part is located at a first metal layer, and is configured to connect two second parts adjacent to the first part,
the first metal layer is in the laminated structure and is adjacent to the front-end-of-line device layer,
the second parts are located at another metal layer other than the first metal layer and a second metal layer,
the second metal layer is in the laminated structure and is farthest from the front-end-of-line device layer among other metal layers that are in the laminated structure,
the third part is located at the second metal layer, and is configured to connect two second parts adjacent to the third part, and
the two adjacent second parts are parallel.

13. The apparatus according to claim 12, wherein parts of the second part that are at two adjacent metal layers are staggered in a thickness direction of the laminated structure.

14. The apparatus according to claim 1, wherein the detection interface is configured to measure a voltage between the first detection interface and the first end of the first conducting wire, and measure a voltage between the detection interface and the second end of the second conducting wire.

15. The apparatus according to claim 14, wherein the detection interface further comprises a detection circuit connection interface configured to connect to a digital die crack detection circuit.

16. The apparatus according to claim 15, wherein the detection circuit interface is a Joint Test Action Group interface.

17. The apparatus according to claim 15, wherein the digital die crack detection circuit is in the function circuit.

18. The apparatus according to claim 1, further comprising:
a seal ring,
wherein the seal ring surrounds an outer side of the die crack detection module.

19. A chip crack detection apparatus, comprising:
a circuit; and
a die crack detection module surrounding the circuit, the die crack detection module comprising:
a front-end-of-line device layer;
a laminated structure on the front-end-of-line device layer, the laminated structure including a conducting wire in the laminated structure;
two resistors connected in series along the conducting wire;
a detection interface coupled with the conducting wire between the two resistors; and
a plurality of capacitors connected in parallel at the front-end-of-line device layer, wherein
a first end of the conducting wire is configured to connect to a positive electrode of a power supply,
a second end of the conducting wire is configured to connect to a negative electrode of the power supply,
the plurality of capacitors are connected to the conducting wire between the first end of the conducting wire and a first resistor of the two resistors, and between the second end of the conducting wire and a second resistor of the two resistors, and
the detection interface is configured to detect whether a die crack occurs in the chip.

20. A chip crack detection apparatus, comprising:
a circuit
a die crack detection module surrounding the circuit, the die crack detection module comprising:
a front-end-of-line device layer;
a laminated structure on the front-end-of-line device layer, the laminated structure including a conducting wire in the laminated structure;
two resistors connected in series along the conducting wire;
a first detection interface coupled with the conducting wire between the two resistors;
a second detection interface coupled with the conducting wire between the two resistors; and
a capacitor connected in parallel at the front-end-of-line device layer, wherein
a first end of the conducting wire is configured to connect to a positive electrode of a power supply,
a second end of the conducting wire is configured to connect to a negative electrode of the power supply,
the capacitor is connected to the conducting wire between the first end of the conducting wire and a first resistor of the two resistors, and between the second end of the conducting wire and a second resistor of the two resistors, and
the first detection interface is configured to measure a voltage between the first detection interface and the first end of the conducting wire, and measure a voltage between the first detection interface and the second end of the conducting wire, and
the second detection interface is configured to connect to a digital die crack detection circuit.

* * * * *